US009405017B2

(12) United States Patent
Lin et al.

(10) Patent No.: US 9,405,017 B2
(45) Date of Patent: Aug. 2, 2016

(54) ULTRA-SENSITIVE RADIATION DOSIMETERS

(75) Inventors: Yu-Ming Lin, West Harrison, NY (US); Jeng-Bang Yau, Yorktown Heights, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 995 days.

(21) Appl. No.: 13/611,162

(22) Filed: Sep. 12, 2012

(65) Prior Publication Data

US 2015/0369925 A1 Dec. 24, 2015

Related U.S. Application Data

(63) Continuation of application No. 13/610,173, filed on Sep. 11, 2012, now abandoned.

(51) Int. Cl.
*G01T 1/24* (2006.01)
*G01T 1/02* (2006.01)
*H01L 31/119* (2006.01)
*H01L 29/16* (2006.01)
*H01L 31/18* (2006.01)
*H01L 51/00* (2006.01)
*H01L 51/42* (2006.01)

(52) U.S. Cl.
CPC ............ *G01T 1/026* (2013.01); *H01L 29/1608* (2013.01); *H01L 31/119* (2013.01); *H01L 31/1804* (2013.01); *H01L 51/0048* (2013.01); *H01L 51/42* (2013.01)

(58) Field of Classification Search
CPC .................. G01T 1/026; G01T 1/04
USPC ........................ 250/370.01, 370.07
See application file for complete search history.

(56) References Cited

U.S. PATENT DOCUMENTS 5,508,523 A * 4/1996 Tawil ................ G01T 1/11 250/337
8,080,805 B2 12/2011 Gordon et al.
2010/0193695 A1 8/2010 Yeow et al.
2011/0024640 A1* 2/2011 Kahilainen ............ G01T 3/00 250/370.07

OTHER PUBLICATIONS

High-performance electronics using dense, perfectly aligned arrays of single-walled carbon nanotubes, Nature Nanotechnology, vol. 2, Apr. 2007, pp. 230-236.*
"Nanoelectronics World Created with Carbon Materials", published by Fujitsu, published Feb. 14, 2010.*
"The use of semiconducting single-walled carbon nanotube films to measure X-ray dose", Carbon 50 (2012), p. 2197-2201 to Kang et al.*

(Continued)

*Primary Examiner* — Kenneth J Malkowski
(74) *Attorney, Agent, or Firm* — Scully Scott Murphy and Presser; Frank Digiglio

(57) ABSTRACT

A method of forming a transistor comprises forming a conducting substrate layer, forming a dielectric layer over the conducting substrate layer, forming a channel over at least a portion of the dielectric layer and forming first and second source/drain regions contacting respective first and second portions of the channel. The channel comprises a thin-film carbon material. The conducting substrate layer, the dielectric layer, the channel and the first and second source/drain regions are formed such that exposure to radiation causes a change in a threshold voltage of the transistor.

8 Claims, 5 Drawing Sheets

(56) References Cited

OTHER PUBLICATIONS

G. Eda et al., "Graphene-Based Composite Thin Films for Electronics," Nano Letters, vol. 9, No. 2, 2009, pp. 814-818.

X-W. Tang et al., "Measurement of Ionizing Radiation Using Carbon Nanotube Field Effect Transistor," Institute of Physics Publishing, Physics in Medicine and Biology, Phys. Med. Biol. 50, 2005, pp. N23-N31.

R.L. Garwin et al., "Learning More from Fukushima Dai-Chi," International Seminars on Planetary Emergencies, 44th session, 2011, 35 pages.

J.R. Schwank et al., "Radiation Effects in MOS Oxides," IEEE Transactions on Nuclear Science, vol. 55, No. 4, Aug. 2008, pp. 1833-1853.

U.S. Appl. No. 12/620,320 filed in the name of C. J-b Yau et al. on Nov. 17, 2009 and entitled "Fabrication of Graphene Nanoelectronic Devices on SOI Structures."

* cited by examiner

ULTRA-SENSITIVE RADIATION DOSIMETERS

CROSS-REFERENCE TO RELATED APPLICATION

This application is a Continuation of U.S. patent application Ser. No. 13/610,173, filed on Sep. 11, 2012, the disclosure of which is fully incorporated herein by reference.

FIELD

The field relates to radiation detection and measurement and, more particularly, to techniques and devices for radiation detection and measurement.

BACKGROUND

Recently, radiation detection has become a pervasive concern for individuals, cities, governments, etc. In particular, since the attacks of Sep. 11, 2001, concerns about "dirty" or radiological-dispersal bombs have increased sharply. In response, many large-scale detectors have been installed at various locations in major metropolitan areas, ocean ports, airports, borders, etc. Radiation detectors have also been installed on top of and inside buildings. In addition, radioactive incidents such as the failing, imploding, or exploding of nuclear reactors can pose a serious risk of radiation leaks and exposure. The recent events in Fukushima, Japan are one example of such an incident.

First responders, including medical personnel, military personnel, and police and firefighters responding to radioactive incidents often require accurate information regarding radiation exposure. As an example, medical personnel need to know an individual's exposure level so that effective triage can be established. Other first responders require accurate information to plan for such tasks as rescue, evacuation, etc. As a result, personal radiation detectors which can record exposure to x-rays, gamma rays and beta rays are also used.

Common types of personal radiation detectors include ionization detectors, Geiger counters and thermoluminescent detectors (TLDs). Geiger counters and ionization detectors can record and display the dose rate (mRad/hr), as well as the integrated dose (Rads) in real time. TLDs are inexpensive but must be processed and read off-site after a period of time, typically one to three months.

SUMMARY

Embodiments of the invention provide techniques and devices for radiation detection and measurement.

For example, in one embodiment, a method of forming a transistor comprises forming a conducting substrate layer, forming a dielectric layer over the conducting substrate layer, forming a channel over at least a portion of the dielectric layer and forming first and second source/drain regions contacting respective first and second portions of the channel. The channel comprises a thin-film carbon material. The conducting substrate layer, the dielectric layer, the channel and the first and second source/drain regions are formed such that exposure to radiation causes a change in a threshold voltage of the transistor.

Further embodiments of the invention comprise one or more of the following features.

The thin-film carbon channel is a graphene layer.

The thin-film carbon channel is a carbon nanotube array.

A thickness of the dielectric layer is determined as a function of a desired dosimetric sensitivity.

The threshold voltage of the apparatus increases linearly as the exposure to radiation increases.

Advantageously, one or more embodiments of the invention allow for increased dosimetric sensitivity.

These and other embodiments of the invention will become apparent from the following detailed description of illustrative embodiments thereof, which is to be read in connection with the drawings.

DETAILED DESCRIPTION

Illustrative embodiments of the invention may be described herein in the context of illustrative methods, apparatus and systems. However, it is to be understood that embodiments of the invention are not limited to the illustrative methods, apparatus and systems described but are more broadly applicable to other suitable methods, apparatus and systems.

Most conventional personal radiation detectors have significant drawbacks. For example, Geiger counters and ionization detectors, while providing real-time information on dose rate and integrated dose, are often large, bulky and expensive. As such, it is impractical for individuals to carry Geiger counters or ionization detectors on their persons at all times. While TLDs are typically inexpensive in comparison to Geiger counters and ionization detectors, TLDs do not provide real-time information on dose rate and integrated dose.

Silicon-based radiation dosimeters address some of the concerns discussed above with respect to current personal radiation detectors, but have drawbacks of their own. For example, fully-depleted silicon-on-insulator (FDSOI) metal oxide semiconductor field effect transistor (MOSFET) radiation dosimeters rely on linear changes in the sub-threshold characteristics (e.g., the threshold voltage, $V_t$) of the FDSOI MOSFET caused by radiation generated charges trapped in a buried oxide (BOX) layer. FDSOI MOSFET radiation dosimeters require relatively thin silicon-on-insulator (SOI), typically less than 40 nm, to allow BOX charges to effectively affect the $V_t$ of the front gate while maintaining dosimetric sensitivity. The SOI must also be fully depleted, which implies a potential contact resistance penalty in FDSOI MOSFET radiation dosimeters. In addition, sub-threshold characteristics of FDSOI MOSFET radiation dosimeters deviate from the linear dependence on radiation exposure at extremely high radiation doses. This can form a buried channel and permanent damage to the SOI.

To overcome the above-noted drawbacks of current personal radiation detectors, including FDSOI MOSFET radiation dosimeters, embodiments of the invention utilize thin-film carbon materials in the FET structure which have increased dosimetric sensitivity without the above-noted sensitivity and SOI thickness tradeoffs associated with FDSOI MOSFET radiation dosimeters.

Figure 1:
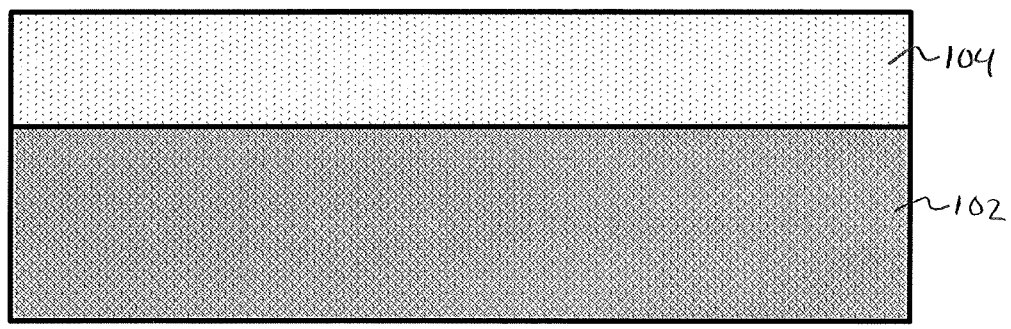
FIGS. 1-3 illustrate a method of forming a transistor, according to an embodiment of the invention.

Embodiments of the invention include methods for forming thin-film carbon channel FET structures. As shown in FIG. 1, apparatus 100 starts with a conducting substrate layer 102 and a dielectric layer 102 formed over the conducting substrate layer 102. The conducting substrate layer 102 may be formed of a heavily-doped bulk Si substrate. The dielectric layer 104 may be formed of thermal $SiO_2$. In one embodiment, the dielectric layer is 300 nm thick.

Figure 2:
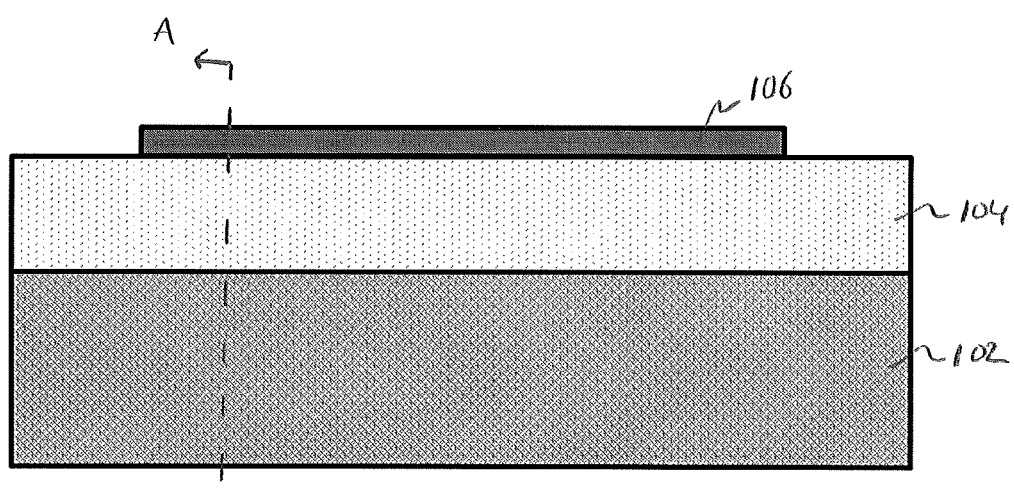

As shown in FIG. 2, a channel 106 is formed over the dielectric layer 102. The channel 106 is formed of a thin-film carbon material. For example, the channel 106 may be a graphene layer, deposited via methods such as mechanical exfoliation, epitaxial growth, etc., followed by a transfer onto the surface of the dielectric layer 102. In other embodiments, the channel 106 may be a semiconducting carbon nanotube (CNT) array or network.

Figure 3:
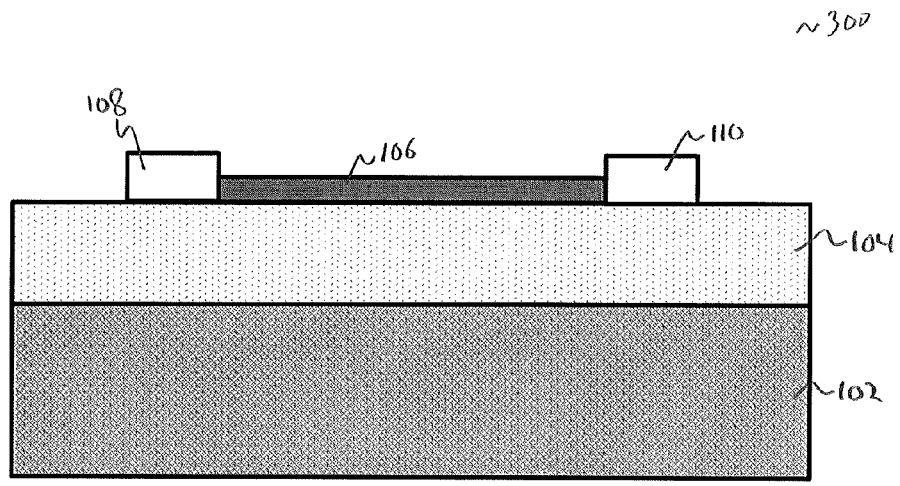

As shown in FIG. 3, first and second source/drain contacts 108 and 110 are formed on the channel 106. First and second source/drain contacts 108 and 110 may be fabricated on the graphene by depositing a metal material on the graphene followed by lift-off. The source/drain contacts 108 and 110 may be formed of any suitable material, including metals such as gold, Pd, Ti, Ni, Cr, Al, etc.

Figure 4:
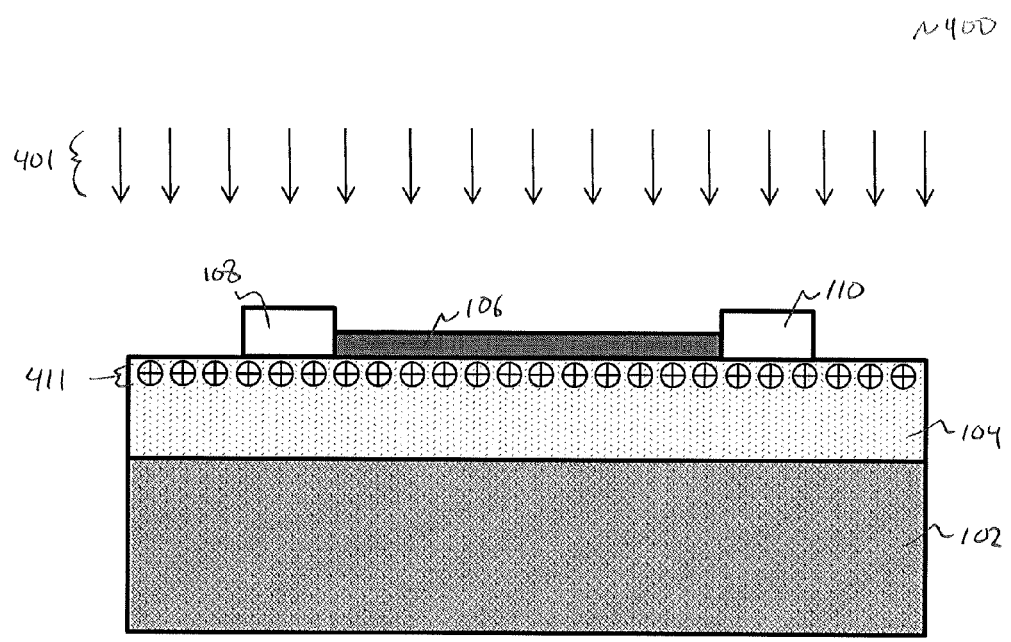
FIG. 4 illustrates a transistor being exposed to radiation, according to an embodiment of the invention.

FIG. 4 shows a transistor 400 formed in accordance with the method described above, with a substrate layer 102, dielectric layer 104, channel 106, and first and second source/drain contacts 108 and 110. As the transistor 400 is exposed to radiation, represented by the arrows 401 in FIG. 4, electron-hole pairs are generated. Electrons will diffuse out of the dielectric layer 104 within picoseconds of radiation exposure while holes 411 will be trapped in the dielectric layer 104. The holes 411 represent positive charges which will cause changes in the threshold voltage $V_t$ of the transistor 400.

As discussed above, ionization radiation will generate electron-hole pairs in the transistor 400. The electron-hole pairs are typically trapped at the interface between the conducting substrate layer 102 and the dielectric layer 104. The holes will transport by proton releases and will hop through localized states in the dielectric layer to cluster towards a surface of the dielectric layer 104 away from the interface between the conducting substrate layer 102 and the dielectric layer 104 as shown in FIG. 4.

Figure 5:
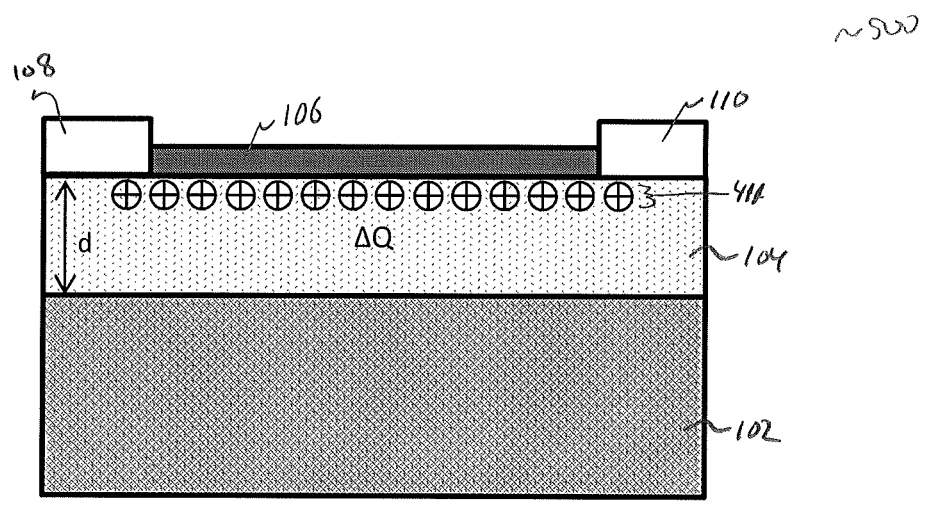
FIG. 5 illustrates a transistor after exposure to radiation, according to an embodiment of the invention.

FIG. 5 shows a transistor 500 with a conducting substrate layer 102, a dielectric layer 104, radiation-induced charges 411 in the dielectric layer 104, a channel 106, and first and second source/drain contacts 108 and 110. When the channel 106 is formed of a graphene layer, the shift in the threshold voltage $\Delta V_t$ is given by:

$$\Delta V_t = \frac{\Delta Q}{C} = \Delta Q \frac{d}{\varepsilon k}$$

where $\Delta Q$ is the induced charge per area, C is the capacitance, d is the thickness of the dielectric layer 104, k is the dielectric constant, and $\in$ is the electric constant. For a 300 nm $SiO_2$ dielectric layer, $\Delta V_t = 8.7 \times 10^7 \Delta Q$. The unit of $\Delta Q$ is Coulomb/cm². A thicker dielectric layer 104 provides better dosimetric sensitivity.

Figure 6:
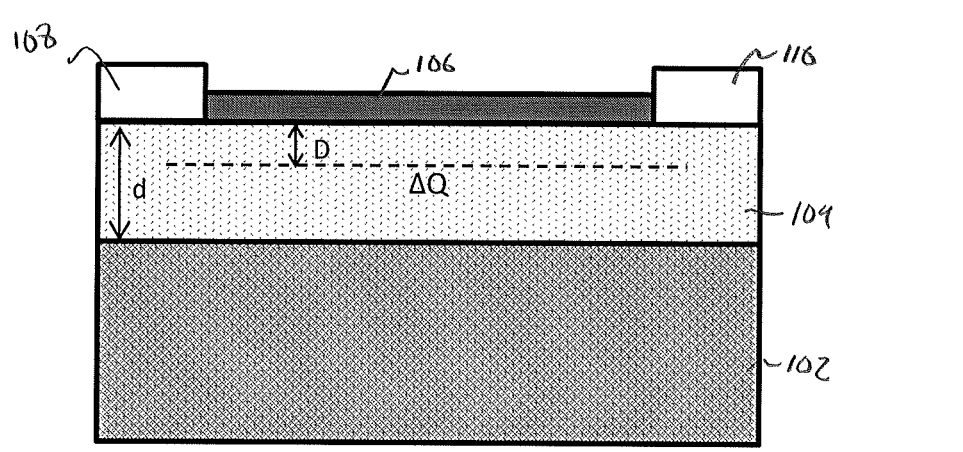
FIG. 6 illustrates an alternate view of a transistor after exposure to radiation, according to an embodiment of the invention.
Figure 7:
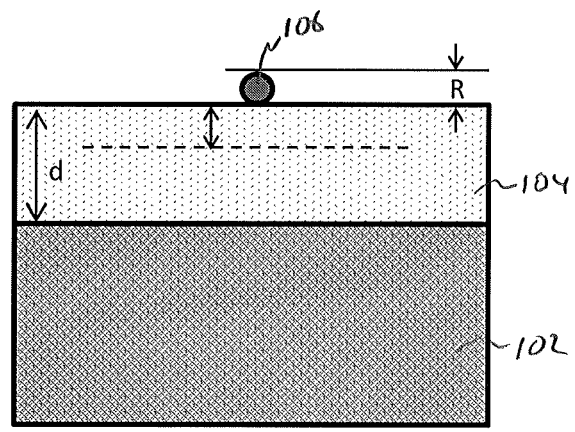
FIG. 7 illustrates a side view of the transistor of FIG. 2 taken along axis A-A, according to an embodiment of the invention.
Figure 8:
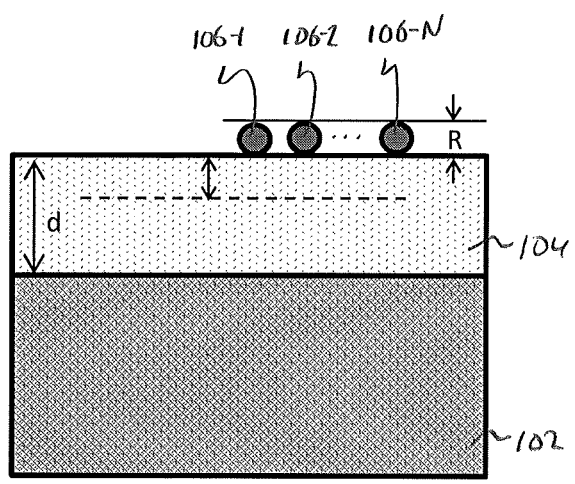
FIG. 8 illustrates a side view of the transistor of FIG. 2 taken along axis A-A in an alternate arrangement, according to an embodiment of the invention.

FIG. 6 shows a transistor 600 with a CNT array channel 106. FIG. 7 is a cross-sectional view of the transistor 200 of FIG. 2 along line A-A. FIG. 7 shows an arrangement where the channel is a single CNT. The capacitance (per unit length) of the CNT with respect to the conducting substrate is given by:

$$C = \frac{2\pi \varepsilon k}{\ln\left(\frac{4d}{R}\right)}$$

Where d is the thickness of the dielectric layer 104 and R is the diameter of the carbon nanotube 106. The shift of the threshold voltage is given by:

$$\Delta V_t = \frac{\Delta Q}{C} = \Delta Q * R \frac{\ln\left(\frac{4d}{R}\right)}{2\pi \varepsilon k}$$

For a semiconducting CNT with a diameter of 2 nm and a dielectric layer thickness of 300 nm, $\Delta V_t = 5.9 \times 10^5 \Delta Q$. The unit of $\Delta Q$ is Coulomb/cm².

FIG. 7 shows a transistor 700 with a CNT array channel 106 with CNTs 106-1 through 106-N. The shift in threshold voltage is even larger for CNT arrays. For example, Table 1 below shows a comparison of the dosimetric sensitivity of CNT array and graphene thin film FETs compared to the dosimetric sensitivity of FDSOI MOSFETs and single CNT FET.

TABLE 1

| | Oxide Charges | Dosimetric Sensitivity (mV/krad) | | |
|---|---|---|---|---|
| | created by radiation per krads | FDSOI MOSFET | Backgated Single CNT FET | Backgated Graphene/CNT Arrays FET |
| 1 MeV Protons | 3 × 10¹⁰/cm² | 4 | 3* | 417* |
| 8 keV X-ray | 5.7 × 10¹⁰/cm² | 5-10 | 5* | 793* |

*Values obtained using 300 nm SiO₂ dielectric layer and CNT with a diameter of 2 nm.

As shown in Table 1, the dosimetric sensitivity of backgated FET with a graphene or CNT array thin-film channel is significantly greater than that associated with FDSOI MOSFETs and single CNT FET arrangements. The superior response of graphene and CNT arrays to radiation generated charges provides significant advantages relative to conventional arrangements such as FDSOI MOSFETs. Further, the threshold voltage of graphene and CNT array channel transistors maintain a linear relationship with exposure to radiation at extremely high doses. As discussed above, FDSOI MOSFETs do not maintain a linear relationship with exposure to radiation at extremely high doses.

Radiation dosimeters built with carbon-based nanomaterials such as graphene and CNT arrays provide several other advantages relative to conventional personal radiation detectors. For example, the graphene and CNT arrays provide an intrinsically radiation-hard channel material that is immune to degradation at high radiation doses. Graphene and CNT array channels may also be extremely thin, which is suitable for applications involving flexible substrates. In some embodiments, as discussed above, the channel is only 2 nm thick. Thin-film carbon channel materials are also suitable for flexible electronics.

In the embodiments described above, the dielectric layer 104 has been described as being a $SiO_2$ layer. In other embodiments, alternate insulator materials with good charge trapping capability may be utilized. For example, silicon nitride (SiNx) insulators can also be used. One skilled in the art will appreciate that various other insulator materials with good charge trapping capability may also be used. In addition, while in various embodiments described above the conducting substrate 102 has been described as being formed of heavily-doped silicon, various other substrates can be used in place of heavily-doped silicon. Silicon carbide (SiC) may be used for epitaxial graphene growth. The substrate may also be a flexible polymer material or a thin-film transistor substrate. One skilled in the art will appreciate that various other substrate types may be utilized.

Figure 9:
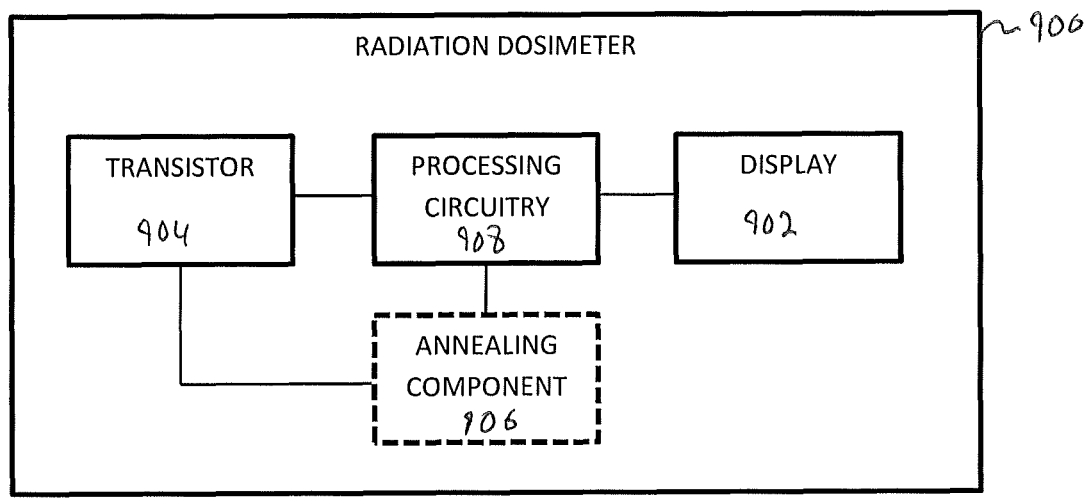
FIG. 9 illustrates a radiation dosimeter, according to an embodiment of the invention.

As shown in FIG. 9, a radiation dosimeter 900 may include a display 902, a transistor 904, an annealing component 906 and processing circuitry 908. The processing circuitry 908 connects the transistor 904, display 902 and annealing component 906. The transistor 904 is a thin-film carbon channel transistor as described above, such as transistor 300 shown in FIG. 3. A radiation level output to the display 902 is a function of the difference between the threshold voltage of the transistor 904 after exposure to radiation and a threshold voltage of the transistor 904 before exposure to radiation. The processing circuitry 908 determines the radiation level. The display 904 may be a variety of display types, such as a liquid crystal display (LCD), light emitting diode (LED) display, etc. The radiation level may be output to the display in the form of a number, color, dosage value, etc.

The radiation dosimeter 900 as shown in FIG. 9 contains an annealing component coupled to the transistor 904. The processing circuitry 908 is connected to the annealing component 904, which is operative to expose at least the dielectric layer of the transistor to a temperature sufficient to anneal the trapped charges in the dielectric layer. As such, after the radiation dosimeter is exposed to radiation, the processing circuitry 908 may direct the annealing component 904 to expose the dielectric layer of the transistor to a temperature for a period of time until the threshold voltage of the transistor is substantially the same as the threshold voltage of the transistor prior to exposure to radiation, allowing the transistor 904 to be reused. The annealing component 904 may also anneal the transistor 904 until the threshold voltage is some predetermined level above the threshold voltage of the transistor 904 prior to exposure to radiation. In addition, while shown as part of the radiation dosimeter 900 in FIG. 9, the annealing component 904 may be external to the radiation dosimeter. One skilled in the art will appreciate that various configurations are possible.

While not explicitly shown in FIG. 9, the radiation dosimeter 900 may also comprise an alarm component. The alarm component may be configured to output a sound or some notification in the display 902 when the exposure to radiation reaches a certain level.

Figure 10:
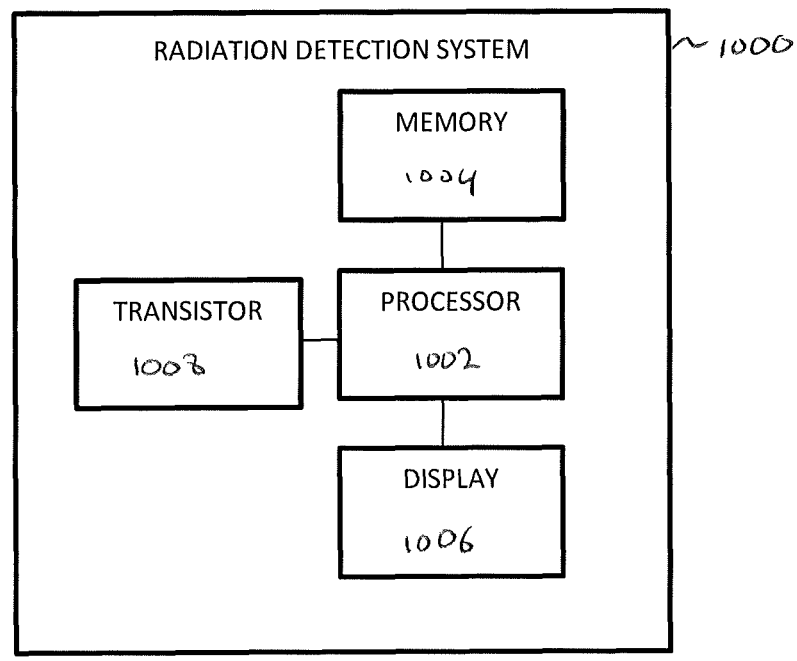
FIG. 10 illustrates a radiation detection system, according to an embodiment of the invention.

Embodiments of the invention may also be incorporated in radiation detection system 1000 as shown in FIG. 10. Radiation detection system 1000 may include a processor 1002 operatively coupled to a memory 1004 and configured to determine a radiation level for a transistor 1008 and output the radiation level to a display 1006. The radiation detection system 1000 may be further operative to store radiation level information in the memory 1004 to track exposure to radiation over a period of time or at one or more locations. It is important to note that while FIG. 10 shows a radiation detection system 1000 with a transistor 1008, embodiments of the invention are not limited solely to this arrangement. For example, a radiation detection system may be coupled to a radiation dosimeter such as that shown in FIG. 9. In addition, the transistor 1008 as shown in FIG. 10 may be removable from the radiation detection system 1000.

Embodiments of the invention may be formed using existing wafer-fabrication technology. The various transistors, radiation dosimeters and radiation detection systems described above can be embedded in cell phones and other mobile devices, as well as being built into credit cards or photo identification such as driver's licenses. First responders can use a reading device that would download information such as integrated doses so that treatment decisions can be made quickly.

As will be appreciated by one skilled in the art, aspects of the present invention may be embodied as a system, apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be but are not limited to, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring again to FIGS. 1-10, the diagrams in the figures illustrate the architecture, functionality, and operation of possible implementations of systems, methods and computer program products according to various embodiments of the present invention. In this regard, each block in a flowchart or a block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

Accordingly, techniques of the invention, for example, as depicted in FIGS. 1-10, can also include, as described herein, providing a system, wherein the system includes distinct modules (e.g., modules comprising software, hardware or software and hardware).

One or more embodiments can make use of software running on a general purpose computer or workstation. Such an implementation may employ, for example, a processor, a memory, and an input/output interface formed, for example, by a display and a keyboard. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to optionally include, for example, one or more mechanisms for inputting data to the processing unit (for example, keyboard or mouse), and one or more mechanisms for providing results associated with the processing unit (for example, display or printer).

The processor, memory, and input/output interface such as a display and keyboard can be interconnected, for example, via a bus as part of a data processing unit. Suitable interconnections, for example, via the bus, can also be provided to a network interface such as a network card, which can be provided to interface with a computer network, and to a media interface, such as a diskette or CD-ROM drive, which can be provided to interface with media.

A data processing system suitable for storing and/or executing program code can include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to a keyboard for making data entries; a display for viewing data; a pointing device for selecting data; and the like) can be coupled to the system either directly (such as via a bus) or through intervening I/O controllers.

Network adapters such as a network interface may also be coupled to the system to enable the data processing system to become coupled to other data processing systems or remote printers or storage devices through intervening private or public networks. Modems, cable modem and Ethernet cards are just a few of the currently available types of network adapters.

As used herein, a "server" includes a physical data processing system running a server program. It will be understood that such a physical server may or may not include a display and keyboard. Further, it is to be understood that components may be implemented on one server or on more than one server.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
   measuring a first threshold voltage of a transistor;
   exposing the transistor to radiation;
   measuring a second threshold voltage of the transistor;
   determining a radiation level based at least in part on a difference between the second threshold voltage and the first threshold voltage;
   annealing the transistor;
   measuring a third threshold voltage of the field effect transistor; and
   repeating the annealing step until the third threshold voltage is substantially the same as the first threshold voltage;
   wherein the transistor comprises a conducting substrate, a dielectric layer formed on the conducting substrate, a thin-film carbon channel formed on the dielectric layer and first and second source/drain regions formed on respective first and second portions of the thin-film carbon channel.

2. The method of claim 1, wherein the conducting substrate layer is one of a heavily-doped silicon substrate material, a flexible polymer material, a thin-film transistor substrate and a silicon carbide substrate material.

3. The method of claim 1, wherein the dielectric layer is one of a silicon dioxide insulator and a silicon nitride insulator.

4. The method of claim 1, further comprising the step of outputting an alarm if the determined radiation level is above a specified threshold level.

5. The method of claim 1, wherein the threshold voltage of the transistor increases linearly as the exposure to radiation increases.

6. The method of claim 1, wherein the channel comprises the graphene layer.

7. The method of claim 1, wherein the channel comprises the carbon nanotube array.

8. The method of claim 1, wherein the step of annealing the transistor comprises exposing at least the dielectric layer of the transistor to a given temperature.

* * * * *